United States Patent
Hwang et al.

(10) Patent No.: US 9,685,357 B2
(45) Date of Patent: Jun. 20, 2017

(54) APPARATUS FOR TREATING SUBSTRATE

(71) Applicant: Semes Co., Ltd., Cheonan-si, Chungcheongnam-do (KR)

(72) Inventors: Soo Min Hwang, Cheonan-si (KR); Hyoung Rae Noh, Cheonan-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 268 days.

(21) Appl. No.: 14/527,897

(22) Filed: Oct. 30, 2014

(65) Prior Publication Data

US 2015/0116674 A1   Apr. 30, 2015

(30) Foreign Application Priority Data

Oct. 31, 2013  (KR) .......................... 10-2013-0131353
Dec. 26, 2013  (KR) .......................... 10-2013-0164396

(51) Int. Cl.
*G03B 27/32* (2006.01)
*G03D 5/00* (2006.01)
(Continued)

(52) U.S. Cl.
CPC .. *H01L 21/67109* (2013.01); *H01L 21/67155* (2013.01); *H01L 21/67173* (2013.01);
(Continued)

(58) Field of Classification Search
CPC ..... G03F 7/16; G03F 7/26; G03F 7/30; G03F 7/38; G03F 7/40; G03F 7/70733;
(Continued)

(56) References Cited

U.S. PATENT DOCUMENTS

2003/0113188 A1   6/2003  Pool
2012/0057861 A1*  3/2012  Matsuoka ........... H01L 21/6715
                                              396/611

FOREIGN PATENT DOCUMENTS

CN          1446742 A    10/2003
CN        101329997 A    12/2008
(Continued)

*Primary Examiner* — Colin Kreutzer
(74) *Attorney, Agent, or Firm* — Harness, Dickey & Pierce, P.L.C.

(57) ABSTRACT

A substrate treating apparatus according to the present invention includes: an index unit having an index robot and a port on which a container containing a substrate is placed; a process treating unit having a development treating unit in which a first development treating chamber and a second development treating chamber for performing a substrate development process are arranged in divided layers; and a first path unit arranged between the development treating unit and the index unit, wherein the first development treating chamber includes a development module, a first heating module, and a first main transport robot arranged in a movement passage accessible to the development module and the first heating module, wherein the first path unit includes a second heating module, a first buffer module, a cooling module, a second buffer module, and a first buffer transport robot arranged in a movement passage accessible to the second heating module, the first buffer module, the cooling module and the second buffer module.

17 Claims, 4 Drawing Sheets

(51) Int. Cl.
  *G03F 7/00*    (2006.01)
  *H01L 21/67*   (2006.01)
  *H01L 21/677*  (2006.01)
  *G03F 7/20*    (2006.01)

(52) U.S. Cl.
  CPC .. *H01L 21/67178* (2013.01); *H01L 21/67184* (2013.01); *H01L 21/67769* (2013.01); *G03F 7/70808* (2013.01); *G03F 7/70991* (2013.01)

(58) Field of Classification Search
  CPC ............... G03F 7/70741; G03F 7/7075; G03F 7/70808; G03F 7/70991; H01L 21/67109; H01L 21/6715–21/67207; H01L 21/67769
  USPC ............... 118/52; 355/27; 396/611; 430/311, 430/327–330
  See application file for complete search history.

(56) References Cited

FOREIGN PATENT DOCUMENTS

| | | |
|---|---|---|
| JP | 2003-209154 A | 7/2003 |
| JP | 2012-033863 A | 2/2012 |
| JP | 2012-054469 A | 3/2012 |
| JP | 2012-199318 A | 10/2012 |
| KR | 10-0274858 B1 | 12/2000 |
| KR | 101059277 B1 | 8/2011 |
| KR | 1020110095242 | 8/2011 |
| KR | 10-2012-0025393 A | 3/2012 |

\* cited by examiner

APPARATUS FOR TREATING SUBSTRATE

CROSS-REFERENCE TO RELATED APPLICATIONS

This U.S. non-provisional patent application claims priority under 35 U.S.C. §119 of Korean Patent Application Nos. 10-2013-0131353, filed on Oct. 31, 2013, and 10-2013-0164396, filed on Dec. 26, 2013, the entire contents of which are hereby incorporated by reference.

BACKGROUND OF THE INVENTION

The present invention disclosed herein relates to a substrate treating apparatus, and more particularly, to a substrate treating apparatus for performing application, development and bake processes.

In general, an apparatus for manufacturing a semiconductor device forms a predetermined film on a substrate and forms the film into a pattern having electrical characteristics to manufacture a semiconductor device. The pattern is formed through sequential or iterative performance of unit processes such as film forming, photolithography, etching and cleaning.

Here, the photolithography process includes an application process for applying a photoresist film on a silicon substrate, an exposure process for selectively exposing the photoresist film using a mask on the substrate on which the photoresist film is formed, a development process for developing the exposed photoresist film to form a microcircuit pattern, and a bake process performed after each of the application process, the exposure process and the development process.

An apparatus for performing the photolithography process includes an additional exposure apparatus for the exposure process and an apparatus provided with an application treating region for the application process, a development treating region for the development process and a bake treating region for the bake process. In a photolithography apparatus for performing the application, development and bake processes, the application treating region and the development treating region are arranged in a double layer on one side of the photolithography apparatus and the bake treating region is arranged on a side opposite to the one side in order to improve the efficiency of substrate transport. Therefore, a robot for transporting a substrate is additionally installed on each layer.

However, such configuration is limited in the improvement of an operation rate of the apparatus. For example, one transport robot arranged on a layer for performing the development process performs seven steps of buffer—post exposure bake—cooling—development—hard bake—cooling—buffer. Therefore, the load on a robot arranged on one layer is too large, reducing the efficiency of production.

SUMMARY OF THE INVENTION

The present invention provides a substrate treating apparatus having a layout for distributing the load of a transport robot.

The present invention provides a substrate treating apparatus for improving the rate of production of substrates while selectively performing a positive development process and a negative development process.

An object of the present invention is not limited thereto, and other objects not mentioned would be clearly understood by those skilled in the art from the disclosure below.

Embodiments of the present invention provide substrate treating apparatuses including: an index unit having an index robot and a port on which a container containing a substrate is placed; a process treating unit having a development treating unit in which a first development treating chamber and a second development treating chamber for performing a substrate development process are arranged in divided layers; and a first path unit arranged between the development treating unit and the index unit, wherein the first development treating chamber includes a development module, a first heating module, and a first main transport robot arranged in a movement passage accessible to the development module and the first heating module, wherein the first path unit includes a second heating module, a first buffer module, a cooling module, a second buffer module, and a first buffer transport robot arranged in a movement passage accessible to the second heating module, the first buffer module, the cooling module and the second buffer module.

In some embodiments, the first buffer module and the cooling module may be arranged at a location accessible by both the first main transport robot and the first buffer transport robot.

In other embodiments, the first buffer module and the cooling module may be stacked between the movement passage of the first main transport robot and the movement passage of the first buffer transport robot.

In still other embodiments, the movement passage of the first main transport robot may be provided in a horizontal direction and the movement passage of the first buffer transport robot may be provided in a vertical direction.

In even other embodiments, the first heating module may be a post exposure bake (PEB) module.

In yet other embodiments, the second heating module may be a hard bake (H/B) module.

In further embodiments, the development module of the first development treating chamber may be provided as any one of a positive development module for performing positive development and a negative development module for performing negative development, wherein the development module of the second development treating chamber may be provided as the other one of the positive development module and the negative development module.

In still further embodiments, the number of the first development treating chambers may be smaller than that of the second development treating chambers.

In even further embodiments, the process treating unit may further include an application treating unit in which application treating chambers for performing a photoresist applying process on the substrate are arranged in divided layers, wherein the application treating unit may be divided from the development treating unit by layer.

In other embodiments of the present invention, substrate treating apparatuses include: an index unit; a development treating unit in which a first development treating chamber for performing a positive development process and a second development treating chamber for performing a negative development process are stacked; and a first path unit arranged between the development treating unit and the index unit, wherein a development module, a post exposure bake (PEB) module and a cooling module are arranged in a movement passage of a first main transport robot so that a PEB process, a cooling process and a development process are sequentially performed, in one of the first development treating chamber and the second development treating chamber, wherein a hard bake (H/B) module for performing an H/B process on a substrate treated in the development module is arranged in a movement passage of a first buffer transport robot, in the first path unit.

In some embodiments, the cooling module may be arranged at a location accessible by both the first main transport robot and the first buffer transport robot, wherein a first buffer module in which the substrate temporarily stays may be stacked in the cooling module.

In other embodiments, the first path unit may further include a second buffer module for transferring the substrate to the index unit.

In still other embodiments, the movement passage of the first main transport robot may be provided in a horizontal direction and the movement passage of the first buffer transport robot may be provided in a vertical direction.

In even other embodiments, the number of the one of the chambers may be smaller than that of the other of the chambers.

In still other embodiments of the present invention, substrate treating apparatuses include: an index unit; a development treating unit in which a first development treating chamber and a second development treating chamber are arranged in divided layers; and a first path unit arranged between the development treating unit and the index unit, wherein treating modules for sequentially performing a posture exposure bake (PEB) process, a cooling process and a development process are arranged in a horizontal movement passage of a first main transport robot, in the first development treating chamber, wherein a treating module for performing a hard bake (H/B) process on a substrate developed in the first development treating chamber is arranged in a vertical movement passage of the first buffer transport robot, in the first path unit, wherein the first buffer transport robot is elevatable so as to move between the layers of the first development treating chamber and the second development treating chamber.

In some embodiments, the first development treating chamber may include one type of a development module between a development module for performing positive development and a development module for performing negative development.

In other embodiments, a first buffer module and a cooling module may be arranged at a location accessible by both the first main transport robot and the first buffer transport robot.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
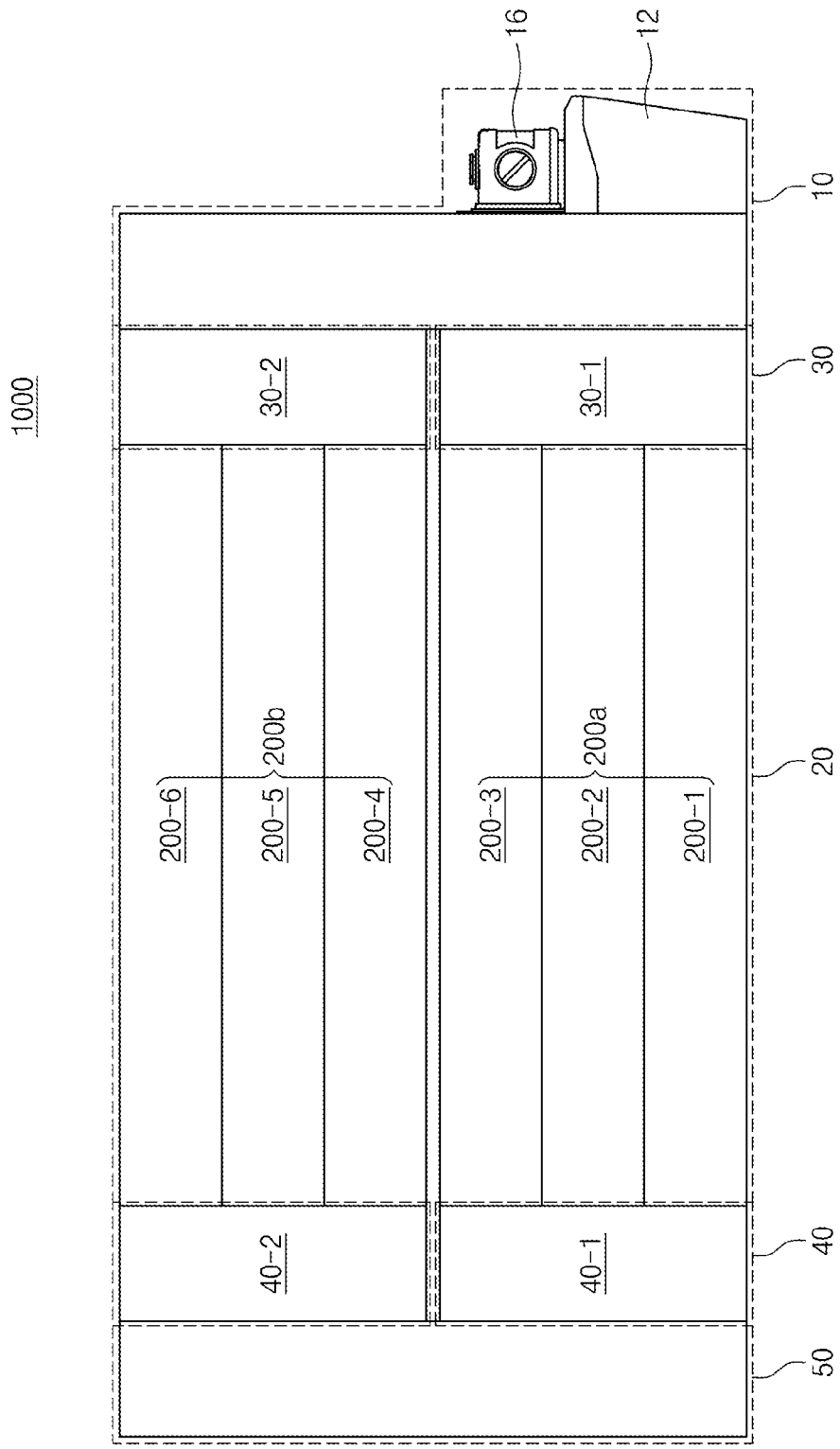
FIG. 1 is an exterior view of a substrate treating apparatus according to an embodiment of the present invention.

The present invention may be implemented in different forms without being limited to the embodiments disclosed herein. The embodiments disclosed herein are provided so that this disclosure will be thorough and complete, and will fully convey the scope of the present invention to those skilled in the art. In the drawings, each device is schematically illustrated to clarify the present invention. Furthermore, each device may be provided with various additional devices that are not described in detail herein. The same reference numerals refer to the same elements throughout the specification.

In the present embodiments, a semiconductor wafer exemplifies a substrate. However, the substrate may be other various substrates such as a photomask and a flat display panel than the semiconductor wafer. Furthermore, in the present embodiments, a substrate treating apparatus exemplarily performs a photolithography process. However, the substrate treating apparatus may perform a cleaning process on another type of a substrate such as a wafer.

Figure 2:
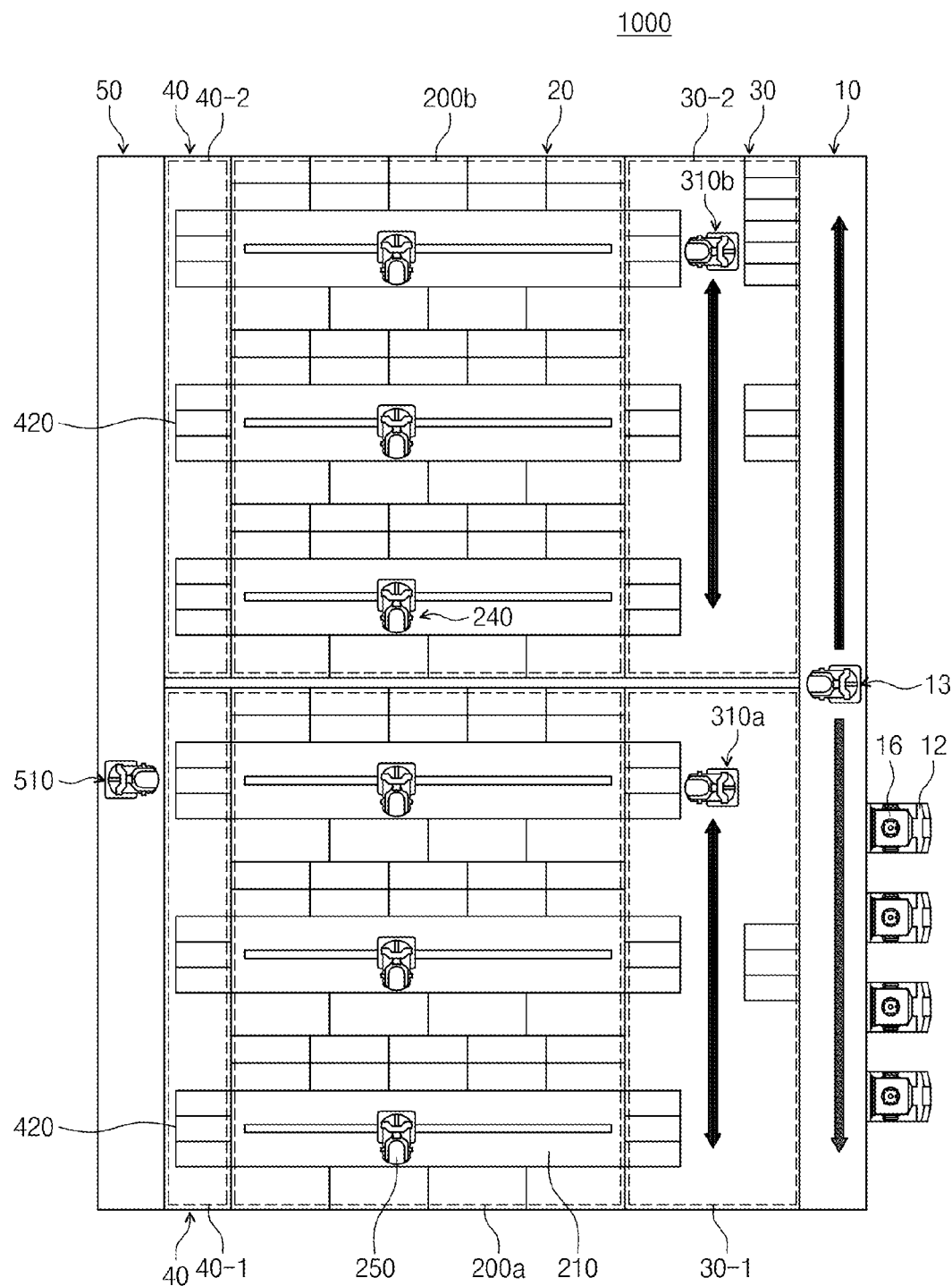
FIG. 2 is a diagram illustrating a layout of each layer of the substrate treating apparatus of FIG. 1.

FIG. 1 is an exterior view of a substrate treating apparatus according to an embodiment of the present invention, and FIG. 2 is a diagram illustrating a layout of each layer of the substrate treating apparatus of FIG. 1.

Referring to FIGS. 1 and 2, a substrate treating apparatus 1000 of the present invention may include an index unit 10, a process treating unit 20, a first path unit 30, a second path unit 40 and an interface unit 50.

The index unit 10, the first path unit 30, the process treating unit 20, the second path unit 40 and the interface unit 50 are arranged in a line. Herein, a direction in which the index unit 10, the first path unit 30, the process treating unit 20, the second path unit 40 and the interface unit 50 are arranged in a line is defined as a first direction, a direction perpendicular to the first direction from a top view is defined as a second direction, and a direction perpendicular to a plane including the first and second directions is defined as a third direction.

A substrate W is moved while being accommodated in a container 16. The container 16 may be sealed from the outside. For example, a front open unified pod (FOUP) having a front door may be used as the container 16. Hereinafter, each element will be described in detail with reference to FIGS. 1 to 3.

(Index Unit)

The index unit 10 is arranged at the front of the first direction of the substrate treating apparatus 1000. The index unit 10 includes four load ports 12 and one index robot 13.

The four load ports 12 are arranged at the front of the index unit 10 in the first direction. The load ports 12 are provided in a plurality and are arranged along the second direction. The number of the load ports 12 may be increased or decreased according to the process efficiency and footprint conditions of the substrate treating apparatus 1000. Containers (e.g., cassettes or FOUPs) that accommodate substrates W to be treated and treatment-completed substrates W are placed on the load ports 12.

The index robot 13 is arranged adjacent to the load ports 12 in the first direction. The index robot 13 is arranged between the load ports 12 and the first path unit 30. The index robot 13 transports a substrate between the first path unit 30 and the load ports 12. The index robot 13 transports the substrate W standing by in a buffer module to the container 16, or transports the substrate W standing by in the container to a buffer module of the first path unit 30.

(Interface Unit)

The interface unit 50 transports a substrate between the second path unit 40 and an exposure device (not illustrated). The interface unit 50 includes an interface robot 510.

Although not illustrated, a buffer module in which a substrate temporarily stands by may be provided to the interface unit 50.

(Process Treating Unit)

In the process treating unit 20, a process for applying photoresist on the substrate W may be performed before the exposure process and a process for developing the substrate W may be performed after the exposure process. The process treating unit 20 may be stacked so that an application treating unit 200a for performing the application process and a development treating unit 200b for performing the development process are arranged in divided layers. The application treating unit 200a may include three layers of application treating chambers 200-1 to 200-3, and the development treating unit 200b may include three layers of development treating chambers 200-4 to 200-6.

For example, each of the chambers 200-1 to 200-6 of the application treating unit 200a and development treating unit 200b may include a central passage 210, a first main transport robot 240 or 250 and treating modules for performing corresponding processes. The treating modules may include heat treatment modules and spin treatment modules, wherein the spin treatment modules may include application modules for the application process and development modules for the development process. As described above, modules suitable for each process may be arranged in each of the chambers 200-1 to 200-6 of the application treating unit 200a and development treating unit 200b.

The first main transport robots 240 and 250 serve for substrate transport in the central passage 210. A handlebar for directly handling the first main transport robots 240 and 250 and a substrate may have a multi-axially drivable structure so as to be rotated or moved in the first, second or third direction.

The treating modules may be installed along the central passage 210 accessible by the first main transport robots 240 and 250.

In the present embodiment, it is illustrated that the application treating chambers of first to third layers are provided with the modules for the application process and the development treating chambers of fourth to sixth layers are provided with the modules for the development process. However, in a different manner, the treating chambers for the development process may be arranged in the first to third layers and the treating chambers for the application process may be arranged in the fourth to sixth layers. Furthermore, the number of the treating chambers may be changed.

(First & Second Path Units)

The first path unit 30 is arranged between the process treating unit 20 and the index unit 10. The first path unit 30 includes a first application path unit 30-1 connected to the application treating chambers 200-1 to 200-3 and a first development path unit 30-2 connected to the development treating chambers 200-4 to 200-6, wherein the first application path unit 30-1 and the first development path unit 30-2 are arranged in divided layers.

The first application path unit 30-1 is provided with an interlayer transport robot 310a for transporting a substrate not only between the application treating unit 200a and the index unit 10 but also between the application treating chambers 200-1 to 200-3.

The first development path unit 30-2 is provided with an interlayer transport robot 310b for transporting a substrate not only between the development treating unit 200b and the index unit 10 but also between the development treating chambers 200-4 to 200-6.

The second path unit 40 is arranged between the interface unit 50 and the process treating unit 20. The second path unit 40 includes a second application path unit 40-1 connected to the application treating chambers 200-1 to 200-3 and a second development path unit 40-2 connected to the development treating chambers 200-4 to 200-6, wherein the second application path unit 40-1 and the second development path unit 40-2 are arranged in divided layers. The second application path unit 40-1 and the second development path unit 40-2 are provided with buffer modules 420 in which substrates temporarily stand by.

The first path unit 30 opposes the second path unit 40 about the process treating unit 20.

Figure 3:
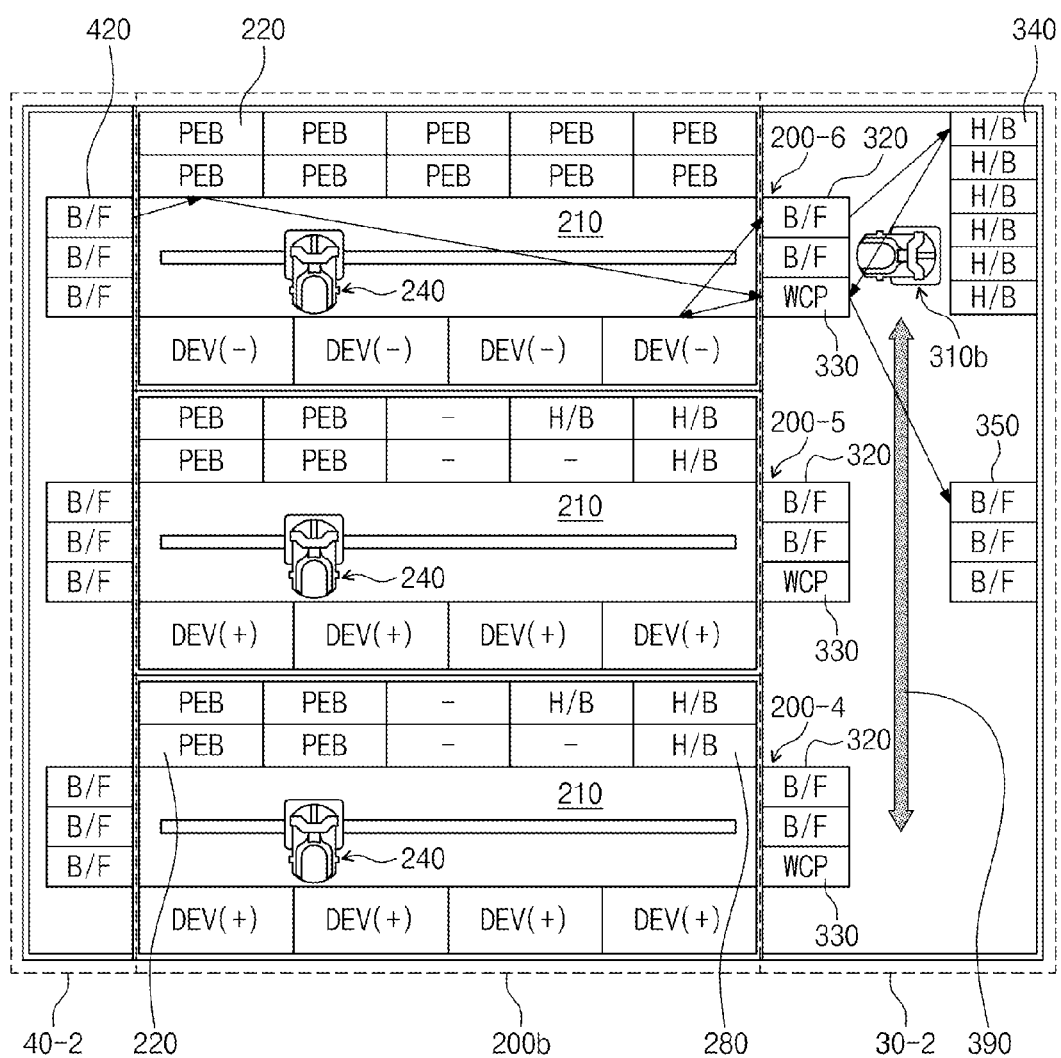
FIG. 3 is a block diagram illustrating a development treating unit, a first development path unit and a second development path unit.
Figure 4:
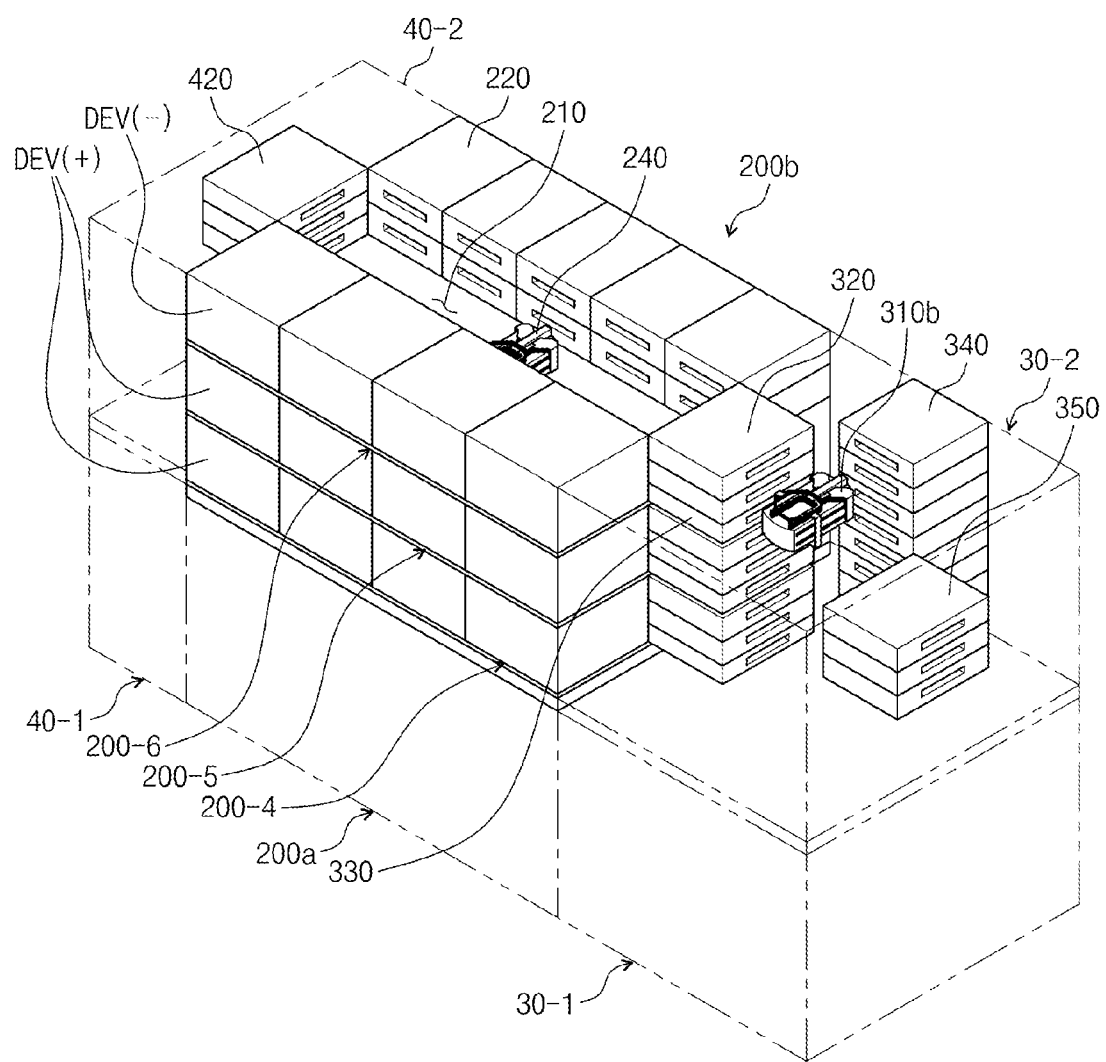
FIG. 4 is a perspective view illustrating the development treating unit, the first development path unit and the second development path unit.

FIGS. 3 and 4 are a block diagram and a perspective view illustrating the development treating unit, the first development path unit and the second development path unit.

Referring to FIGS. 3 and 4, the development treating unit 200b includes the development treating chambers 200-4 to 200-6 of three layers. Each of the development treating chambers 200-4 to 200-6 may perform a positive development process or a negative development process for each layer. For example, the development treating chambers 200-4 and 200-5 of the fourth and fifth layers may be provided with four development modules DEV+ for performing the positive development process for each layer, and the development treating chamber 200-6 of the sixth layer may be provided with four development modules DEV− for performing the negative development process. That is, the development treating unit 200b includes eight positive development modules DEV+ and four negative development modules DEV−.

In the development treating unit 200b according to the present embodiment, the number of the negative development modules DEV− is smaller than that of the positive development modules DEV+. Therefore, the development treating chamber 200-6 of the sixth layer provided with the negative development modules DEV− has a structure different from the structures of the development treating chambers 200-4 and 200-5 of the fourth and fifth layers. The development treating chamber 200-6 of the sixth layer is different from the development treating chambers 200-4 and 200-5 of the fourth and fifth layers in that a hard bake module is not arranged in the same layer but is arranged in an additional region, i.e., the first development path unit 30-2.

For example, the development treating chamber 200-6 of the sixth layer includes the negative development modules DEV−, first heating modules 220 and the first main transport robot 240. The negative development module DEV- and the first heating module 220 are arranged in the movement passage 210 accessible by the first main transport robot 240. Here, the first heating module may be a post exposure bake (PEB) module. The number of the first heating units of the development treating chamber 200-6 of the sixth layer is greater than that of the first heating units of the development treating chambers 200-4 and 200-5 of the fourth and fifth layers. Therefore, in the case where the PEB is frequently performed, as in the case of a system semiconductor producing process, a standby time due to a temperature change is reduced to decrease production loss, thereby improving the efficiency of operation of the apparatus.

The first development path unit 30-2 includes a second heating module 340, a first buffer module 320, a cooling module 330, a second buffer module 350 and a first buffer transport robot 310b. The second heating module 340, the first buffer module 320, the cooling module 330 and the second buffer module 350 are arranged in a movement passage 390 accessible by first buffer transport robot 310b. Here, the second heating module 340 may be a hard bake (H/B) module.

The first buffer module 320 and the cooling module 330 are arranged on a location accessible by both the first main transport robot 240 and the first buffer transport robot 310b. For example, the first buffer module 320 and the cooling module 330 may be stacked between the movement passage 210 of the first main transport robot 240 and the movement passage 390 of the first buffer transport robot 310b. The movement passage 210 of the first main transport robot 240 is provided in a horizontal direction, and the movement passage 390 of the first buffer transport robot 310b is provided in a vertical direction. The first buffer module 320 and the cooling module 330 have openings in the provided direction of the first main transport robot 240 and in the provided direction of the first buffer transport robot 310b so that the first main transport robot 240 may import or export a substrate and the first buffer transport robot 310b may import or export a substrate.

The development treating chambers 200-4 and 200-5 of the fourth and fifth layers include the positive development modules DEV+, the first heating modules 220, a second heating module 280 and the first main transport robot 240. The positive development modules DEV+, the first heating modules 220 and the second heating module 280 are arranged in the movement passage 210 accessible by the first main transport robot 240.

In the development treating chambers 200-4 and 200-5 of the fourth and fifth layers, the development process of post exposure bake—cooling—development—hard bake—cooling is performed in the same layer. Furthermore, in the development treating chamber 200-6 of the sixth layer, only the process of post exposure bake—cooling—development is performed in the same layer, and the remaining process of hard bake—cooling is performed in the first development path unit 30-2.

As described above, in the development treating chamber 200-6 of the sixth layer provided with the negative development modules DEV– fewer than the number of the positive development modules DEV+, the first main transport robot 240 performs five steps through a buffer module 420 —> the first heating module 220 —> the cooling module 330 —> the negative development module DEV– —> the first buffer module 320, and the first buffer transport robot 310b of the first development path unit 30-2 performs four steps through the first buffer module 320—> the second heating module 340 —> the cooling module 330 —> the second buffer module 350. In this manner, two transport robots are distributed to perform the development process within five steps.

For example, provided that a cycle time of one step of a transport robot is about 3.5 seconds, about 146 sheets of substrates per hour may be treated during the negative development process in a typical layout, but about 205 sheets of substrates per hour may be treated in the development treating unit of the present invention. Therefore, by virtue of the transport distribution and the optimization of use of a robot according to the present invention, the rate of production of substrates may be improved by about 40%.

In the case where the development treating chambers 200-5 and 200-6 of the fifth and sixth layers perform the negative development process and the development treating chamber 200-4 of the fourth layer performs the positive development process, the development treating chamber 200-4 of the fourth layer provided with the positive development modules DEV+ may be reconfigured to have an arrangement structure different from the arrangement structures of the development treating chambers 200-5 and 200-6 of the fifth and sixth layers, since the number of the positive development modules DEV+ is smaller than that of the negative development modules DEV–.

The substrate treating apparatus of the present invention may be usefully applied to a lithography apparatus that performs both the negative development process and the positive development process.

According to the present invention, the load of a transport robot may be distributed, thereby improving the rate of production of substrates.

According to the present invention, the rate of production of substrates may be improved while selectively performing the positive development process and the negative development process.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate treating apparatus comprising:
an index unit having an index robot and a port on which a container containing a substrate is placed;
a process treating unit having a development treating unit in which a first development treating chamber and a second development treating chamber for performing a substrate development process are arranged in divided layers; and
a first path unit arranged between the development treating unit and the index unit, wherein
the first development treating chamber comprises a development module, a first heating module, and a first main transport robot arranged in a movement passage accessible to the development module and the first heating module, wherein
the first path unit comprises a second heating module, a first buffer module, a cooling module, a second buffer module, and a first buffer transport robot arranged in a movement passage accessible to the second heating module, the first buffer module, the cooling module and the second buffer module.

2. The substrate treating apparatus of claim 1, wherein the first buffer module and the cooling module are arranged at a location accessible by both the first main transport robot and the first buffer transport robot.

3. The substrate treating apparatus of claim 1, wherein the first buffer module and the cooling module are stacked between the movement passage of the first main transport robot and the movement passage of the first buffer transport robot.

4. The substrate treating apparatus of claim 1, wherein the movement passage of the first main transport robot is provided in a horizontal direction and the movement passage of the first buffer transport robot is provided in a vertical direction.

5. The substrate treating apparatus of claim 1, wherein the first heating module is a post exposure bake (PEB) module.

6. The substrate treating apparatus of claim 1, wherein the second heating module is a hard bake (H/B) module.

7. The substrate treating apparatus of claim 1, wherein the development module of the first development treating chamber is provided as any one of a positive development module for performing positive development and a negative development module for performing negative development, wherein the development module of the second development treating chamber is provided as the other one of the positive development module and the negative development module.

8. The substrate treating apparatus of claim 1, wherein the number of the first development treating chambers is smaller than that of the second development treating chambers.

9. The substrate treating apparatus of claim 1, wherein the process treating unit further comprises an application treating unit in which application treating chambers for performing a photoresist applying process on the substrate are arranged in divided layers, wherein the application treating unit is divided from the development treating unit by layer.

10. A substrate treating apparatus comprising:
an index unit;
a development treating unit in which a first development treating chamber for performing a positive development process and a second development treating chamber for performing a negative development process are stacked; and
a first path unit arranged between the development treating unit and the index unit, wherein
a development module, a post exposure bake (PEB) module and a cooling module are arranged in a movement passage of a first main transport robot so that a PEB process, a cooling process and a development process are sequentially performed, in one of the first development treating chamber and the second development treating chamber, wherein
a hard bake (H/B) module for performing an H/B process on a substrate treated in the development module is arranged in a movement passage of a first buffer transport robot, in the first path unit.

11. The substrate treating apparatus of claim 10, wherein the cooling module is arranged at a location accessible by both the first main transport robot and the first buffer transport robot, wherein a first buffer module in which the substrate temporarily stays is stacked in the cooling module.

12. The substrate treating apparatus of claim 11, wherein the first path unit further comprises a second buffer module for transferring the substrate to the index unit.

13. The substrate treating apparatus of claim 11, wherein the movement passage of the first main transport robot is provided in a horizontal direction and the movement passage of the first buffer transport robot is provided in a vertical direction.

14. The substrate treating apparatus of claim 11, wherein the number of the one of the chambers is smaller than that of the other of the chambers.

15. A substrate treating apparatus comprising:
an index unit;
a development treating unit in which a first development treating chamber and a second development treating chamber are arranged in divided layers; and
a first path unit arranged between the development treating unit and the index unit, wherein
treating modules for sequentially performing a posture exposure bake (PUB) process, a cooling process and a development process are arranged in a horizontal movement passage of a first main transport robot, in the first development treating chamber, wherein
a treating module for performing a hard bake (H/B) process on a substrate developed in the first development treating chamber is arranged in a vertical movement passage of the first buffer transport robot, in the first path unit, wherein
the first buffer transport robot is elevatable so as to move between the layers of the first development treating chamber and the second development treating chamber.

16. The substrate treating apparatus of claim 15, wherein the first development treating chamber comprises one type of a development module between a development module for performing positive development and a development module for performing negative development.

17. The substrate treating apparatus of claim 15, wherein a first buffer module and a cooling module are arranged at a location accessible by both the first main transport robot and the first buffer transport robot.

* * * * *